(12) United States Patent
Park et al.

(10) Patent No.: US 11,489,120 B2
(45) Date of Patent: Nov. 1, 2022

(54) ORGANIC LIGHT EMITTING DISPLAY DEVICE

(71) Applicant: SAMSUNG DISPLAY CO., LTD., Yongin-si (KR)

(72) Inventors: Sung June Park, Suwon-si (KR); Jung-Hun Lee, Hwaseong-si (KR); Ji Hwa Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 182 days.

(21) Appl. No.: 17/083,494

(22) Filed: Oct. 29, 2020

(65) Prior Publication Data
US 2021/0210690 A1 Jul. 8, 2021

(30) Foreign Application Priority Data
Jan. 3, 2020 (KR) .................... 10-2020-0000963

(51) Int. Cl.
| | |
|---|---|
| *G09F 9/30* | (2006.01) |
| *H01L 51/00* | (2006.01) |
| *G02B 1/14* | (2015.01) |
| *G02B 1/16* | (2015.01) |

(52) U.S. Cl.
CPC ............ *H01L 51/0037* (2013.01); *G02B 1/14* (2015.01); *G02B 1/16* (2015.01); *G09F 9/301* (2013.01); *H01L 51/0097* (2013.01)

(58) Field of Classification Search
CPC ... G09F 9/301; G06F 1/1652; H01L 27/3246; H01L 27/3258; H01L 27/3262; H01L 27/3272; H01L 27/3279; H01L 51/0035; H01L 51/0037; H01L 51/0097;
(Continued)

(56) References Cited

U.S. PATENT DOCUMENTS

| | | | |
|---|---|---|---|
| 2015/0077952 A1* | 3/2015 | Kim | .................... H01L 51/5253 427/58 |
| 2017/0028677 A1* | 2/2017 | Lee | ......................... G02B 1/10 |
| 2017/0092884 A1* | 3/2017 | Zhang | .................. G06F 3/0412 |

(Continued)

FOREIGN PATENT DOCUMENTS

| | | |
|---|---|---|
| KR | 10-2018-0125116 | 11/2018 |
| KR | 1020180125116 | * 11/2018 |

(Continued)

*Primary Examiner* — Joe H Cheng
(74) *Attorney, Agent, or Firm* — F. Chau & Associates, LLC

(57) ABSTRACT

A display device includes: a substrate including a display area and a folding area positioned in a portion of the display area; a display structure disposed on the substrate; a protection film disposed on the substrate and overlapping the folding area; an adhesive member disposed between the protection film and the substrate, wherein the protection film adheres to the substrate by the adhesive member; a first antistatic layer disposed between the protection film and the adhesive member, wherein the first antistatic layer includes a first compound; a second antistatic layer disposed on a bottom surface of the protection film, wherein the second antistatic layer includes a second compound; and a supporting member disposed on the second antistatic layer, wherein the supporting member includes an opening overlapping the folding area.

20 Claims, 3 Drawing Sheets

(58) Field of Classification Search
CPC ..... H01L 2251/5338; G02B 1/14; G02B 1/16; Y02E 10/549
See application file for complete search history.

(56) References Cited

U.S. PATENT DOCUMENTS

2018/0033978 A1* 2/2018 Ohno ................. H01L 51/5246
2018/0047938 A1* 2/2018 Kishimoto ............ H01L 27/323
2018/0355175 A1* 12/2018 Han ........................ C09J 7/20
2020/0257338 A1* 8/2020 Park ..................... G06F 1/1641
2021/0062033 A1* 3/2021 Kim ........................ G02B 1/14

FOREIGN PATENT DOCUMENTS

| KR | 10-2019-0005285 | | 1/2019 |
| KR | 10-1958203 | | 3/2019 |
| KR | 1020190005285 | * | 10/2019 |
| KR | 20200038141 A | * | 4/2020 |

* cited by examiner

ORGANIC LIGHT EMITTING DISPLAY DEVICE

CROSS-REFERENCE TO RELATED APPLICATION

This application claims priority under 35 USC § 119 to Korean Patent Application No. 10-2020-0000963, filed on Jan. 3, 2020 in the Korean intellectual Property Office (KIPO), the disclosure of which is incorporated by reference herein in its entirety.

TECHNICAL FIELD

Exemplary embodiments of the present invention relate generally to an organic light emitting display device. More particularly, exemplary embodiments of the present invention relate to the organic light emitting display device including a protection film.

DISCUSSION OF THE RELATED ART

A typical organic light emitting display device may include an organic light emitting element that emits a light by itself. Accordingly, the organic light emitting display device may be implemented thinner than a liquid crystal display device. As the organic light emitting display device may be implemented with a relatively small thickness, the organic light emitting display device may be provided with flexible characteristics.

Generally, the organic light emitting display device having the flexible characteristic may include a protection film for supporting a flexible substrate. To adhere for the protection film to the substrate, after a bottom surface of an adhesive member is adhered to a top surface of the protection film, a release film located on a top surface of the adhesive member may be removed to adhere to a bottom surface of the substrate to the adhesive member. In addition, a static electricity may be generated in a process of removing the release film. When the static electricity is transferred to the substrate, a characteristic of a transistor may be changed (e.g., a threshold voltage of the transistor may be shifted) or an organic light emitting diode disposed on the substrate may be damaged.

SUMMARY

According to an exemplary embodiment of the present invention, a display device includes: a substrate including a display area and a folding area positioned in a portion of the display area; a display structure disposed on the substrate; a protection film disposed on the substrate and overlapping the folding area; an adhesive member disposed between the protection film and the substrate, wherein the protection film adheres to the substrate by the adhesive member; a first antistatic layer disposed between the protection film and the adhesive member, wherein the first antistatic layer includes a first compound; a second antistatic layer disposed on a bottom surface of the protection film, wherein the second antistatic layer includes a second compound; and a supporting member disposed on the second antistatic layer, wherein the supporting member includes an opening overlapping the folding area.

In an exemplary embodiment of the present invention, each of the first antistatic layer and the second antistatic layer overlaps the folding area.

In an exemplary embodiment of the present invention, the adhesive member overlaps the folding area.

In an exemplary embodiment of the present invention, a bottom surface of the first antistatic layer contacts the protection film, and wherein a top surface of the first antistatic layer contacts the adhesive member.

In an exemplary embodiment of the present invention, the adhesive member contacts the substrate.

In an exemplary embodiment of the present invention, the second compound is a same as the first compound.

In an exemplary embodiment of. the present invention, the adhesive member is a pressure sensitive adhesive including an acrylate compound.

In an exemplary embodiment of the present invention, the protection film includes a polyimide.

In an exemplary embodiment of the present invention, the first compound includes a PEDOT:PSS(poly(3,4-ethylenedioxythiophene) poly(styrene sulfonate)), an urethane compound, and an isocyanate.

In an exemplary embodiment of the present invention, the substrate includes a polyimide.

In an exemplary embodiment of the present invention, the display device further includes: a cushion disposed between the second antistatic layer and the supporting member.

In an exemplary embodiment of the present invention, the cushion includes at least one of an acrylic resin, a polyurethane, a thermoplastic polyurethane, a latex, a polyurethane foam, or a polystyrene foam.

In an exemplary embodiment of the present invention, the supporting member includes a metal material.

According to an exemplary embodiment of the present invention, a display device includes: a substrate including a display area and a folding area disposed in the display area; a display structure disposed on the substrate; a first adhesive member disposed on a bottom surface of the substrate and overlapping the folding area; a first antistatic layer disposed on a bottom surface of the first adhesive member and overlapping the folding area; a protection film disposed on a bottom surface of the first antistatic layer; a cushion disposed on the protection film; and a supporting member disposed on the cushion.

In an exemplary embodiment of the present invention, the display device further includes a second antistatic layer disposed between the protection film and the cushion.

In an exemplary embodiment of the present invention, a second adhesive member is disposed between the second antistatic layer and the cushion.

In an exemplary embodiment of the present invention, the protection film contacts the first antistatic layer and the second antistatic layer.

In an exemplary embodiment of the present invention, the first antistatic layer includes a same material as the second antistatic layer.

In an exemplary embodiment of the present invention, the supporting member includes a plurality of holes overlapping the folding area.

In an exemplary embodiment of the present invention, the protection film overlaps the folding area.

BRIEF DESCRIPTION OF THE DRAWINGS

The above and other features of the present invention will become more apparent by describing in detailed exemplary embodiments thereof with reference to the accompanying drawings, in which.

DETAILED DESCRIPTION OF THE EMBODIMENTS

Hereinafter, exemplary embodiments of the present invention will be explained in detail with reference to the accompanying drawings.

Figure 1:
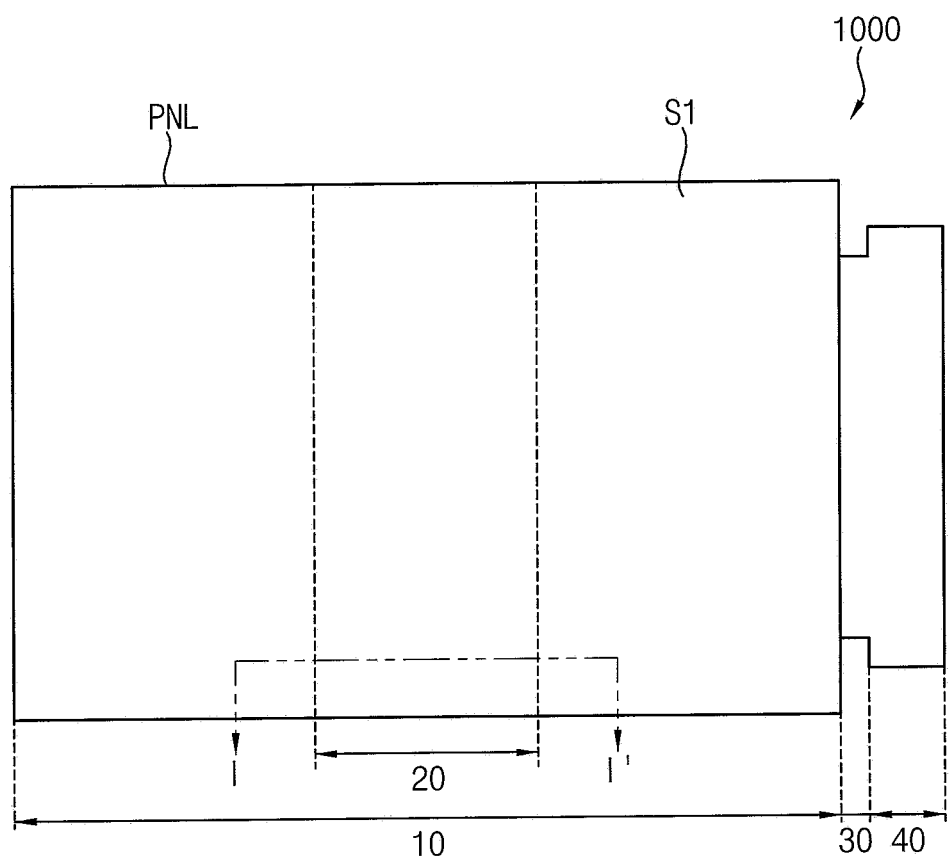
FIG. 1 is a plan view illustrating an organic light emitting display device according to an exemplary embodiment of the present invention.
Figure 2:
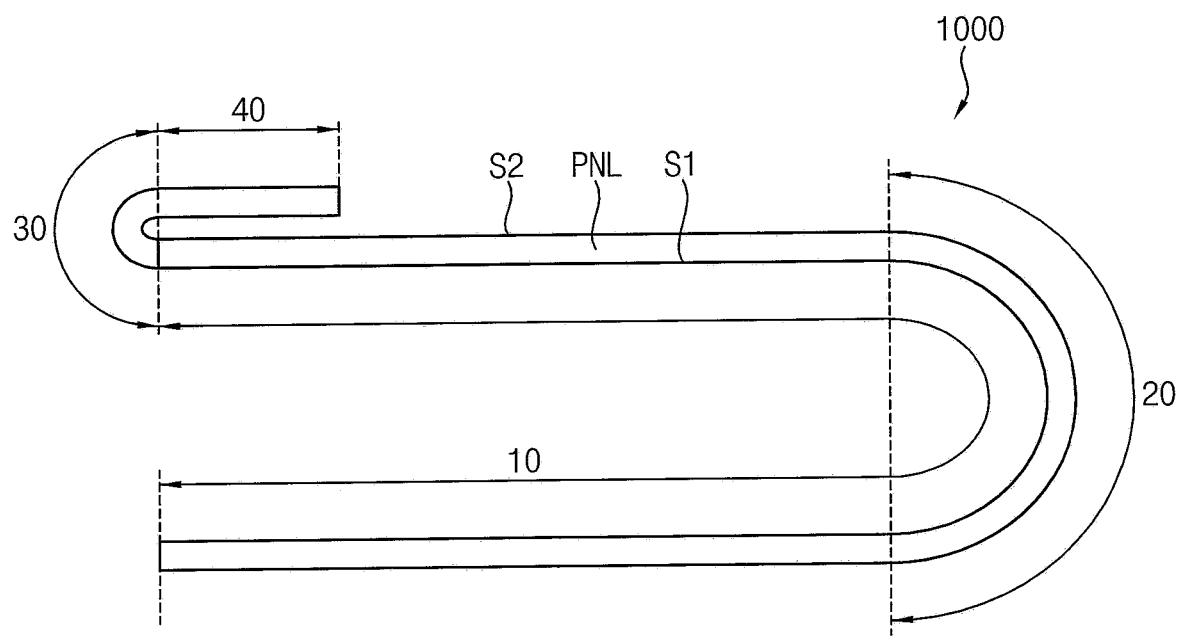
FIG. 2 is a side view illustrating a shape in which the organic light emitting display device of FIG. 1 is folded.
Figure 3:
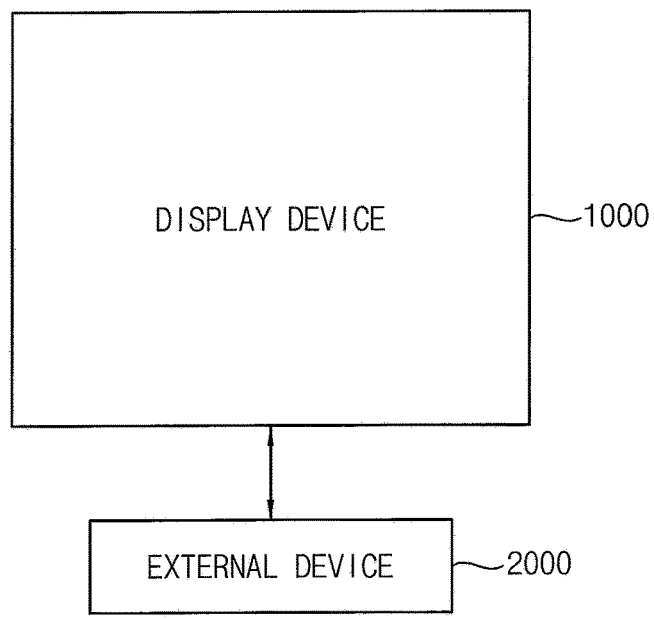
FIG. 3 is a block diagram illustrating an external device electrically connected to the display device of FIG. 1.

FIG. 1 is a plan view illustrating an organic light emitting display device according to an exemplary embodiment of the present invention. FIG. 2 is a side view illustrating a shape in which the organic light emitting display device of FIG. 1 is folded. FIG. 3 is a block diagram for describing an external device electrically connected to the display device of FIG. 1.

Referring to FIGS. 1, 2, and 3, the organic light emitting display device 1000 may be divided into a display area 10, a bending area 30, and a pad area 40.

A display panel PNL may be disposed in the display area 10, and an image may he displayed in the display area 10 through the display panel PNL. For example, the display panel PNL may include a top surface S1 on which the image is displayed and a bottom surface S2 opposite to the top surface S1. As an additional example, a plurality of pixels may be disposed on the top surface S1 of the display panel PNL to display an image.

The display area 10 may include a folding area 20. For example, the folding area 20 may be positioned in a portion of the display area 10. For example, the display panel PNL may be disposed in the folding area 20 and the image may be displayed in the folding area 20 through the display panel PNL. In addition, the folding area 20 may be an area in which the display device 1000 is folded or unfolded. For example, when the folding area 20 is unfolded, as shown in FIG. 1, the organic light emitting display device 1000 is unfolded and the top surface S1 of the display panel PNL positioned in the folding area 20 may be exposed to a user such that the user may watch the image. In addition, when the folding area 20 is folded, as shown in FIG. 2, the organic light emitting display device 1000 is folded and the user may conveniently carry the organic light emitting display device 1000. For example, the size of the organic light emitting display device 1000, when folded, may be smaller than when the organic light emitting display device 1000 is unfolded.

As the bending area 30 is bent, the pad area 40 may overlap the display area 10. Pad electrodes electrically connected to an external device 2000 that generates signals may be disposed in the pad area 40, and connection electrodes electrically connecting the pad electrodes and the display panel PNL to each other may be disposed in the bending area 30. Accordingly the signals generated from the external device 2000 may be provided to the display panel PNL through the pad electrodes and the connection electrodes.

Figure 4:
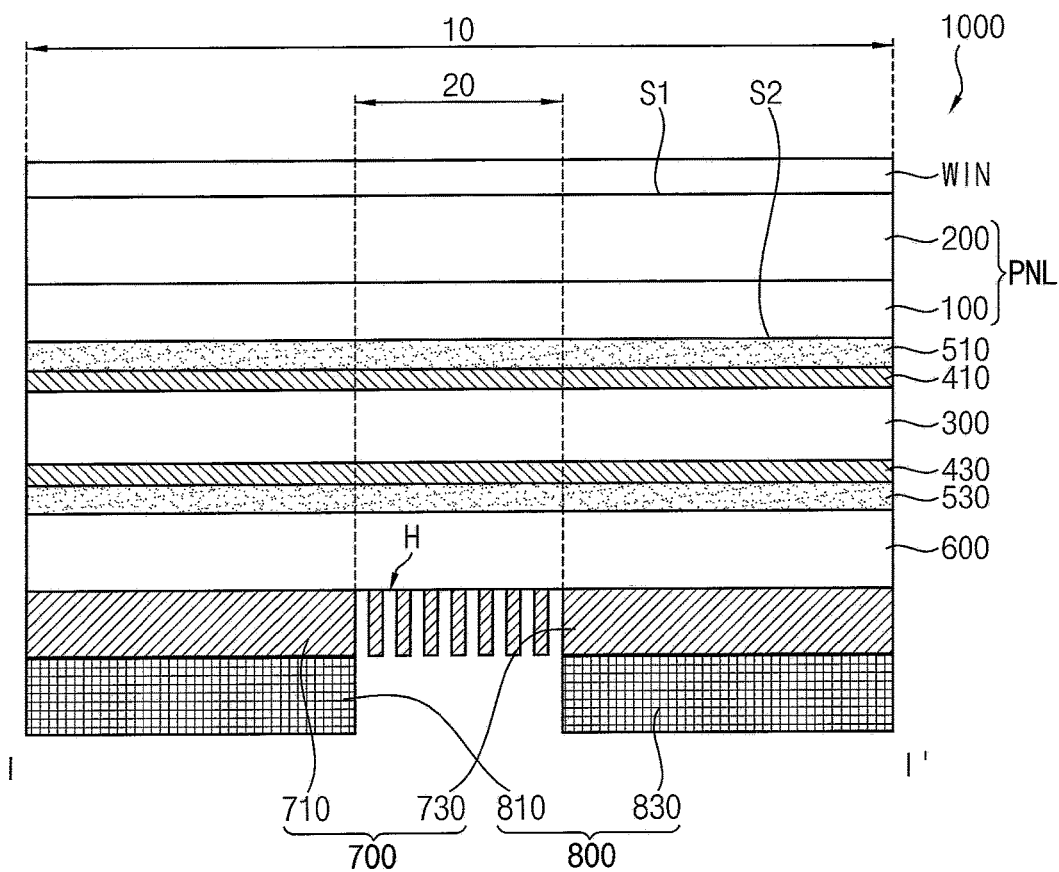
FIG. 4 is a cross-sectional view taken along line I-I' of FIG. 1.
Figure 5:
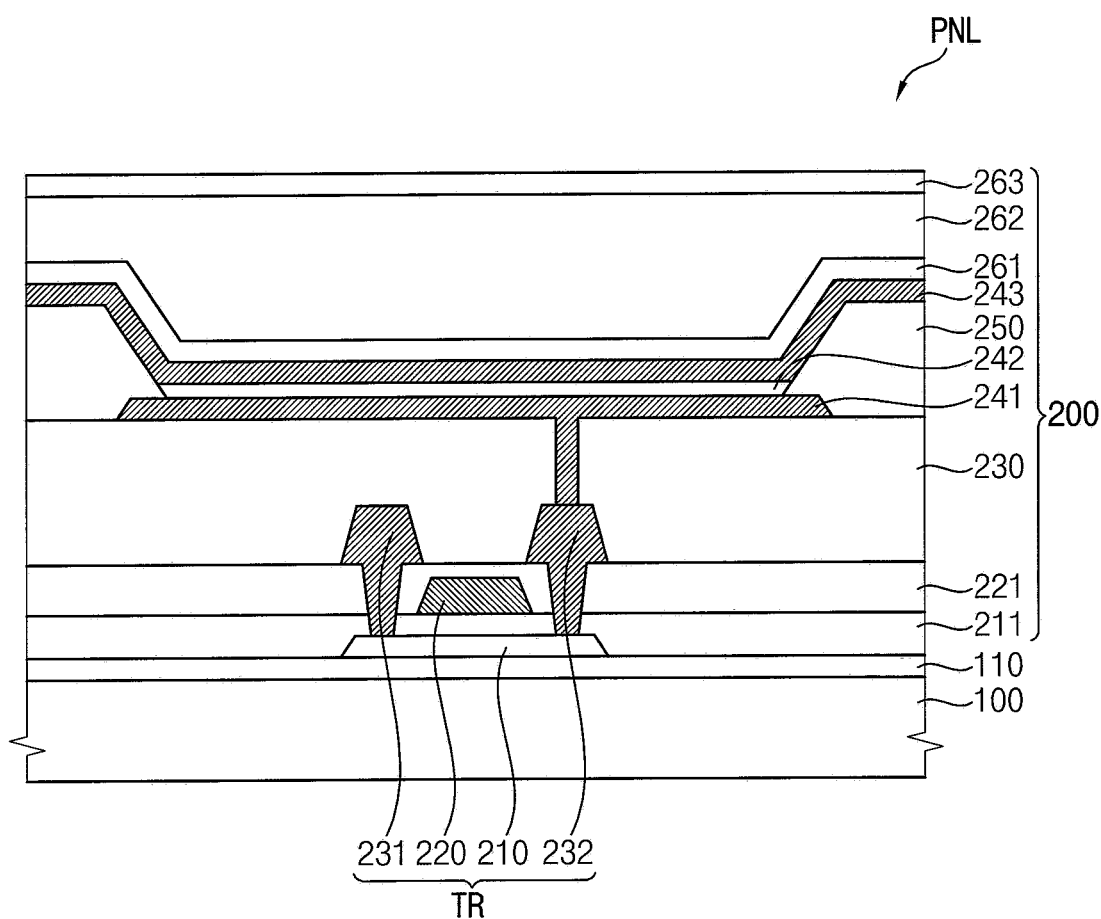
FIG. 5 is a cross-sectional view of a display panel included in the organic light emitting display device of FIG. 1.

FIG. 4 is a cross-sectional view taken along line I-I' of FIG. 1. FIG. 5 is a cross-sectional view of a display panel included in the organic light emitting display device of FIG. 1.

Referring to FIGS. 1 and 4, the organic light emitting display device 1000 may include the display panel PNL, a protection film 300, a first antistatic layer 410, a second antistatic layer 430, a first adhesive member 510, a second adhesive member 530, a cushion 600, a supporting member 700, a bracket 800, and a window WIN.

Referring to FIG. 5, the display panel PNL may include a substrate 100, a buffer layer 110, and a display structure 200. The display structure 200 may include an active pattern 210, a first insulating layer 211, a gate electrode 220, a second insulating layer 221, a source electrode 211, a drain electrode 232, a via insulating layer 230, a first electrode 241, an emitting layer 242, a second electrode 243, a pixel defining layer 250, a first inorganic layer 261, an organic layer 262, and a second inorganic layer 263.

The substrate 100 may include, for example, a glass, a quartz, a plastic, and so on. For example, the substrate 100 may be a plastic substrate for implementing a flexible display device and may include a polyimide ("PI"). In an exemplary embodiment of the present invention, the substrate 100 may have a structure in which at least one PI layer and at least one barrier layer are alternately stacked.

The buffer layer 110 may be disposed on the substrate 100. The buffer layer 110 may prevent a phenomenon in which, for example, metal atoms or impurities are diffused from the substrate 100 into the active pattern 210. In an exemplary embodiment of the present invention, the organic light emitting display device 1000 may include at least two buffer layers. In exemplary embodiment of the present invention, the organic light emitting display device 1000 may not include the buffer layer 110.

The active pattern 210 may be disposed on the buffer layer 110. The active pattern 210 may include, for example, a silicon semiconductor, a metal oxide semiconductor, and so on. The first insulating layer 211 may include an insulating material and may cover the active pattern 210. The gate electrode 220 may include, for example, a metal, an alloy, a conductive metal oxide, and so on, and may be disposed on the first insulating layer 211. The second insulating layer 221 may include an insulating material, and may cover the gate electrode 220. The source electrode 231 and the drain electrode 232 may include, for example, a metal, an alloy, a conductive metal oxide, and so on, and may be disposed on the second insulating layer 221. The via insulating layer 230 may cover the source and drain electrodes 231 and 232, and, may include an organic insulating material. In addition, the via insulating layer 230 may have a substantially flat top surface.

In addition, the active pattern 210, the gate electrode 220, the source electrode 231, and the drain electrode 232 may form a transistor TR. The transistor TR may output a voltage (or, e.g., a signal), which is input to the source electrode 231, through the drain electrode 232 in response to a gate signal (or, e.g., a scan signal) provided to the gate electrode 220.

The first electrode 241 may be disposed on the via insulating layer 230, The first electrode 241 may be provided with a first voltage from the drain electrode 232. The pixel defining layer 250 may be disposed on the via insulating layer 230 and may include an opening exposing at least a portion of the first electrode 241. For example, the opening of the pixel defining layer 250 may expose at least a portion of a top surface of the first electrode 241. The emitting layer 242 may be disposed on the first electrode 241 in the opening. The second electrode 243 may be disposed on the emitting layer 242 and may be provided with a second voltage.

In addition, due to a voltage difference between the first voltage and the second voltage, a light may be emitted from the emitting layer 242, and accordingly, the first electrode 241, the emitting layer 242, and the second electrode 243 may form an organic light emitting diode.

A thin film encapsulation may be disposed on the second electrode 242. The thin film encapsulation may have a structure in which the first inorganic layer 261, the organic layer 262, and the second inorganic layer 263 are alternately stacked to prevent moisture and oxygen from penetrating from an outside.

Referring to FIG. 4, the protection film 300 may be disposed on a bottom surface of the substrate 100. The protection film 300 may prevent moisture and oxygen from penetrating from an outside and may absorb external shocks. As described above, the substrate 100 may be, for example, a flexible plastic substrate to implement a flexible display device, and the protection film 300 may support the substrate 100.

The protection film 300 may overlap the display area 10. For example, the protection film 300 may overlap the folding area 20, and accordingly, the protection film 300 may support the substrate 100 overlapping the folding area 20. Therefore, the substrate 100 may be supported by the protection film 300 and a deformation of a shape of the substrate 100 in the folding area 20 may be prevented. For example, the protection film 300 may prevent the substrate 100 overlapping the folding area 20 from sagging in the folding area 20. In addition, the protective film 300 may prevent the display panel PNL from being damaged by absorbing an impact when the substrate 100 overlapping the folding area 20 is deformed or receives an external force.

In addition, the protection film 300 may be a plastic film. For example, the protection film 300 may include polyethersulfone ("PS"), polyacrylate ("PAR"), polyetherimide ("PEI"), polyethylenenaphthalate ("PEN") polyphenylene sulfide ("PPS"), polyarylate, polycarbonate ("PC"), poly (arylene ethersulfone), polyethylene terephthalate ("PET"), PI, and so on.

The first adhesive member 510 may be disposed between the protection film 300 and the substrate 100, so that the protection film 300 adheres to the substrate 100 by the first adhesive member 510. In an exemplary embodiment of the present invention, a bottom surface of the first adhesive member 510 may contact the first antistatic layer 410 coated on the protection film 300, and a top surface of the first adhesive member 510 may contact the substrate 100, For example, the first adhesive member 510 may directly contact the first antistatic layer 410 and the substrate 100.

In an exemplary embodiment of the present invention, the first adhesive member 510 may overlap the folding area 20 so that the protection film 300 overlapping the folding area 20 adheres to the substrate 100 overlapping the folding area 20. In this case, for the organic light emitting display device 1000 to repeatedly perform folding and unfolding, a flexible first adhesive member 510 may be used. Furthermore, to prevent a shape of the substrate 100 and the protection film 300 from being deformed even when folding and unfolding of the organic light emitting display device 1000 are repeated, the first adhesive member 510, disposed between the substrate 100 and the protection film 300, may be durable.

In an exemplary embodiment of the present invention, the first adhesive member 510 may be an organic adhesive member. For example, the first adhesive member 510 may be an optically clear adhesive ("OCA"), an optically clear resin ("OCR"), a pressure sensitive adhesive ("PSA"), and so on. In an exemplary embodiment of the present invention, the first adhesive member 510 may be the PSA including an acrylate compound, an urethane compound, a silicon compound, and so on.

In addition, the organic light emitting display device 1000 may generate defects due to a static electricity, and to prevent the defects, a configuration that performs an antistatic function may be provided between the substrate 100 and the protection film 300.

For example, to manufacture the organic light emitting display device 1000, the first adhesive member 510 may have a structure of an adhesive sheet having top and bottom release films attached to both surfaces. In addition, after attaching the first adhesive member 510, from which the bottom release film of the adhesive sheet is removed, to the protective film 300, the first adhesive member 510, from which the top release film is removed, may be attached to the substrate 100. However, the present invention is not limited thereto. For example, the first adhesive member 510 may be attached to the protective film 300 after the first adhesive member 510 may be attached to the substrate 100.

However, the static electricity may be generated by peeling charge generated when the release film is removed from the first adhesive member 510. A foreign matter may be attached to a surface of the first adhesive member 510 by the static electricity In addition, when the static electricity is transferred to the display panel PNL, a characteristic of the transistor TR may be changed (e.g., a threshold voltage of the transistor TR may be shifted) or the display panel PNL may be destroyed, such as the first and second electrodes 241 and 243 being damaged.

According to a comparative example, to prevent the static electricity from being generated in a first adhesive member disposed between a protection film and a substrate of an organic light emitting display device, an antistatic material is added to the first adhesive member. However, to satisfy characteristics of the first adhesive member such as the flexibility, the durability, and the adhesiveness, it may be desirable to limit an addition of a material other than an adhesive material in the first adhesive mentber. For example, to simultaneously perform an adhesive function and an antistatic function, when the antistatic material is added to the first adhesive member including the adhesive material, the first adhesive member may not provide the above-described characteristics such as the flexibility, the durability, and the adhesiveness.

The organic light emitting display device 1000 according to an exemplary embodiment of the present invention may include the first antistatic layer 410 disposed between the protection film 300 and the first adhesive member 510. Since the first antistatic layer 410 includes the antistatic material, the first antistatic layer 410 may prevent a generation of the static electricity or may prevent the static electricity from being transferred to the display panel PNL. In addition, since the antistatic material is not additionally added in the first adhesive member 510, the first adhesive member 510 may provide the characteristics such as the flexibility, the durability, and the adhesiveness.

For example, the first antistatic layer 410 may be disposed on a top surface of the protection film 300 by a coating method, a printing method, and so on. For example, the first antistatic layer 410 may be coated on the top surface of the protection film 300 by a roll-to-roll method, a spray coating method, a slit coating method, and so on.

In an exemplary embodiment of the present invention, a bottom surface of the first antistatic layer 410 may contact the protection film 300, and a top surface of the first antistatic layer 410 may contact the first adhesive member 510. For example, the first antistatic layer 410 may directly contact the protection film 300 and the first adhesive member 510.

The first antistatic layer 410 may be made of a first compound. In an exemplary embodiment of the present invention, the first compound may include a PEDOT:PSS poly(3,4-ethylenedioxythiophene poly(styrene sulfonate)), an urethane compound, and/or isocyanate.

In addition, to strengthen a coating characteristic of the first adhesive member 510 disposed on the first antistatic layer 410, a surface energy difference among the protection film 300, the first antistatic layer 410, and the first adhesive member 510 should be considered. Here, a surface energy may mean a sum of dispersive energy and polar energy.

For example, as described above, since a material of the first adhesive member 510 satisfying characteristics such as the flexibility, the durability, and the adhesiveness is limited, the surface energy of the first antistatic layer 410 coated on the protective film 300 may be a certain value or higher. Furthermore, even if the surface energy of the first antistatic layer 410 is greater than the certain value, when the polar energy of the first antistatic layer 410 is less than a certain value (e.g., about 12 mN/m), the coating characteristic of the first adhesive member 510 may deteriorate.

Table 1 may be a table showing changes in the surface energy, the polar energy, and coating characteristic according to the protection film 300 and the first antistatic layer 410.

TABLE 1

| experiment | Protection film | First antistatic layer | Surface energy (mN/m) | Polar energy (mN/m) | Coating characteristic |
|---|---|---|---|---|---|
| experiment 1 | A1 | B1 | 39.15 | 12.29 | Good |
| experiment 2 | A1 | B2 | 42.92 | 5.08 | Bad |
| experiment 3 | A2 | B1 | 42.3 | 13.7 | Good |
| experiment 4 | A2 | B2 | 29.5 | 0.08 | Bad |

To perform the experiments, 'A1' or 'A2' was used to represent the protection film 300 and 'B1' or 'B2' was used to represent the first antistatic layer 410. The 'A1' and the 'A2' may be a specific protection film 300. For example, the protection film 300 may be classified according to a ratio of weight of the PI to a total weight of the protection film 300. The 'B1' and the 'B2' may be a specific first antistatic layer 410. For example, the first antistatic layer 410 may be classified according to a ratio of weight of the PEDOT:PSS to a total weight of the first antistatic layer 410, a ratio of weight of the urethane compound to the total weight of the first antistatic layer 410, and/or a ratio of weight of the isocyanate to the total weight of the first antistatic layer 410. The PSA including the acrylate compound was used as the first adhesive member 510.

Referring to Table 1, in experiment 1, the 'A1' and the 'B1' were used. In experiment 1, the surface energy of the first antistatic layer 410 coated on the protection film 300 was measured to be about 39.15 mN/m, and the polar energy was measured to be about 12.29mN/m. In this case, the coating characteristic of the first adhesive member 510 was relatively good.

In experiment 2, the 'A1' and the 'B2' were used. In experiment 2, the surface energy of the first antistatic layer 410 coated on the protection film 300 was measured to be about 42.92 mN/m, and the polar energy was measured to be about 5.08 mN/m. In this case, the coating characteristic of the first adhesive member 510 was relatively bad.

In experiment 3, the 'A2' and the 'B1' were used. In experiment 3, the surface energy of the first antistatic layer 410 coated on the protection film 300 was measured to be about 42.3 mN/m, and the polar energy was measured to be about 13.7 mN/m. In this case, the coating characteristic of the first adhesive member 510 was relatively good.

In experiment 4, the 'A2' and the 'B2' were used. In experiment 4, the surface energy of the first antistatic layer 410 coated on the protection film 300 was measured to be about 29.5 mN/m, and the polar energy was measured to be about 0.08 mN/m. In this case, the coating characteristic of the first adhesive member 510 was relatively bad.

Referring to above experiments, depending on a combination of the protection film 300 and the first antistatic layer 410, the polar energy of the first antistatic layer 410 coated on the protection film 300 may be changed. When the polar energy was about 12 mN/m or lower (e.g., experiment 2 and experiment 4), the coating characteristic of the first adhesive member 510 was relatively good. According to an exemplary embodiment of the present invention, the protection film 300 and the antistatic layer 410 may be combined so that the polar energy is about 12 mN/m or higher. Accordingly, the first adhesive member 510 may be uniformly coated on the first antistatic layer 410 and may not be detached from the first antistatic layer 410.

In addition, when the protection film 300, the first antistatic layer 410, and the first adhesive member 510 are sequentially stacked, to prevent the defect due to the static electricity, a sheet resistance of the first adhesive member 510 should be a predetermined value (e.g. about 1011 ohm/sq or higher). According to an exemplary embodiment of the present invention, the sheet resistance of the first antistatic layer 410 may be about 1011 ohm/sq or lower, and the sheet resistance of the first adhesive layer 510 may be about 1011 ohm/sq or lower. Accordingly, the first antistatic layer 410 and the first adhesive member 510 may have a relatively low sheet resistance, and the organic light emitting display device 1000 may prevent the defect due to the static electricity.

The second adhesive member 530 may be disposed between the protection film 300 and the cushion 600, so that the protection film 300 adheres to the cushion 600. In an exemplary embodiment of the present invention, the second adhesive member 530 may include substantially the same material as the first adhesive member 510. In an exemplary embodiment of the present invention, a bottom surface of the second adhesive member 530 may contact the cushion 600, and a top surface of the second adhesive member 530 may contact the second antistatic layer 430 coated on a bottom surface of the protection film 300.

The second antistatic layer 430 may be disposed between the protection film 300 and the cushion 600. For the second antistatic layer 430 to prevent the defect due to the static electricity, the second antistatic layer 430 may include a second compound. In an exemplary embodiment of the present invention, the second compound may be a same as the first compound. For example, the second antistatic layer 430 may include the same material as that of the first antistatic layer 410. However, the present invention is not limited thereto. In addition, the second antistatic layer 430 may be disposed on the bottom surface of the protection film 300 by a coated method, a printing method, and so on. In addition, after the first antistatic layer 440 is disposed on the top surface of the protection film 300, the second antistatic layer 430 may be disposed on the bottom surface of the protection film 300. However, the present invention is not limited thereto. For example, after the second antistatic layer 430 is disposed on the bottom surface of the protection film 300, the first antistatic layer 410 may be disposed on the top surface of the protection film 300.

The cushion 600 may be disposed on a bottom surface of the second adhesive member 530. Since the cushion 600 cushions an external shock that is applied to the display panel PNL, the cushion 600 may protect the display panel PNL. For example, the cushion 600 may include a material that can cushion by containing air, such as a sponge or a foam material. In addition, for the display panel PNL to easily repeat folding and unfolding, the cushion 600 may include a flexible material. For example, the cushion 600 may include an acrylic resin, a polyurethane, a thermoplastic polyurethane, a latex, a polyurethane foam, a polystyrene foam, and so on.

The supporting member 700 may be disposed on a bottom surface of the cushion 600. The supporting member 700 may support the display panel PNL. In an exemplary embodiment of the present invention, the supporting member 700 may include a material having a rigidity. For example, the supporting member 700 may include a metal material such as an invar, which is an alloy of a nickel (Ni) and an iron (Fe), stainless steel ("SUS"), titanium (Ti), copper (Cu), and so on.

In addition, the supporting member 700 may include a plurality of openings H overlapping the folding area 20. Since the supporting member 700 includes the openings H at the folding area 20, the supporting member 700 may support the display panel PNL, and the display panel PNL may be easily folded and unfolded at the folding area 20. In addition, the openings H overlapping the folding area 20 may prevent wrinkles from forming on the upper surface S1, overlapping the folding area 20, of the display panel PNL. In exemplary embodiment of the present invention, the supporting member 700 may include a first supporting member 710 and a second supporting member 730, and the plurality of openings H may be provided between the first supporting member 710 and the second supporting member 730.

In an exemplary embodiment of the present invention, the openings H may exist as empty spaces, and when the organic light emitting display device 1000 is folded or unfolded, a shape of each of the openings H may be changed.

The bracket 800 may be disposed on the supporting member 700. For example, the bracket 800 may be disposed on the bottom surface of the supporting member 700. The bracket 800 may be disposed on an outermost side of the organic light emitting display device 1000 so that the bracket 800 may protect the organic light emitting display device 1000. For example, the bracket 800 may overlap at least a portion of the display area 10. As an additional example, the bracket 800 may further cover a side surface of the organic light emitting display device 1000. In addition, the bracket 800 may include at least one opening overlapping the folding area 20, and accordingly, the bracket 800 may include a first bracket 810 and the second bracket 820.

The window WIN may be disposed on the display panel PNL. The window WIN may constitute a top surface of the organic light emitting display device 1000, and may protect the display panel PNL. To implement the flexible organic light emitting display device 1000, the window WIN may include, for example, a polymethyl methacrylate ("PMMA"), a polyethylene terephthalate ("PET"), and so on.

The substrate 100, which is disposed in the display area 10 including the folding area 20, of the organic light emitting display device 1000 may be supported by the protection film 300 overlapping the folding area 20. Accordingly, the deformation of the shape of the substrate 100 in the folding area 20 may be prevented. In addition, since the organic light emitting display device 1000 includes the first antistatic layer 410 disposed between the protection film 300 and the first adhesive member 510, the generation of the static electricity may be prevented or the static electricity may not be transferred to the display panel PNL. In addition, since the antistatic material is not additionally added in the first adhesive member 510, the first adhesive member 510 may provide the characteristics such as the flexibility, the durability, and the adhesiveness.

The present invention may be applied to a display device and an electronic device using the display device. For example, the present invention may be applied to a cellular phone, a smart phone, a video phone, a smart pad, a smart watch, a tablet PC, a car navigation system, a television, a computer monitor, a laptop, etc.

While the present invention has been described with reference to exemplary embodiments thereof, it will be understood by those of ordinary skill in the art that various changes in form and details may be made thereto without departing from the spirit and scope of the present invention.

What is claimed is:

1. A display device comprising:
   a substrate including a display area and a folding area positioned in a portion of the display area;
   a display structure disposed on the substrate;
   a protection film disposed on the substrate and overlapping the folding area;
   an adhesive member disposed between the protection film and the substrate, wherein the protection film adheres to the substrate by the adhesive member;
   a first antistatic layer disposed between the protection film and the adhesive member, wherein the first antistatic layer includes a first compound;
   a second antistatic layer disposed on a bottom surface of the protection film, wherein the second antistatic layer includes a second compound; and
   a supporting member disposed on the second antistatic layer, wherein the supporting member includes an opening overlapping the folding area.

2. The display device of claim 1, wherein each of the first antistatic layer and the second antistatic layer overlaps the folding area.

3. The display device of claim 2, wherein a bottom surface of the first antistatic layer contacts the protection film, and wherein a top surface of the first antistatic layer contacts the adhesive member.

4. The display device of claim 1, wherein the adhesive member overlaps the folding area.

5. The display device of claim 1, wherein the adhesive member contacts the substrate.

6. The display device of claim 5, wherein the second compound is a same as the first compound.

7. The display device of claim 1, wherein the adhesive member is a pressure sensitive adhesive including an acrylate compound.

8. The display device of claim 1, wherein the protection film includes a polyimide.

9. The display device of claim 8, wherein the first compound includes a PEDOT:PSS(poly(3,4-ethylenedioxythiophene) poly(styrene sulfonate)), an urethane compound, and an isocyanate.

10. The display device of claim 1, wherein the substrate includes a polyimide.

11. The display device of claim 1, further comprising:
a cushion disposed between the second antistatic layer and the supporting member.

12. The display device of claim 11, wherein the cushion includes at least one of an acrylic resin, a polyurethane, a thermoplastic polyurethane, a latex, a polyurethane foam, or a polystyrene foam.

13. The display device of claim 11, wherein the supporting member includes a metal material.

14. A display device comprising:
a substrate including a display area and a folding area disposed in the display area;
a display structure disposed on the substrate;
a first adhesive member disposed on a bottom surface of the substrate and overlapping the folding area;
a first antistatic layer disposed on a bottom surface of the first adhesive member and overlapping the folding area;
a protection film disposed on a bottom surface of the first antistatic layer;
a cushion disposed on the protection film; and
a supporting member disposed on the cushion.

15. The display device of claim 14, further comprising a second antistatic layer disposed between the protection film and the cushion.

16. The display device of claim 15, wherein a second adhesive member is disposed between the second antistatic layer and the cushion.

17. The display device of claim 15, wherein the protection film contacts the first antistatic layer and the second antistatic layer.

18. The display device of claim 15, wherein the first antistatic layer includes a same material as the second antistatic layer.

19. The display device of claim 14, wherein the supporting member includes a plurality of holes overlapping the folding area.

20. The display device of claim 14, wherein the protection film overlaps the folding area.

* * * * *